(12) United States Patent
Shimabe et al.

(10) Patent No.: US 8,952,507 B2
(45) Date of Patent: Feb. 10, 2015

(54) WIRING BOARD AND METHOD FOR MANUFACTURING WIRING BOARD

(71) Applicant: Ibiden Co., Ltd., Ogaki-shi (JP)

(72) Inventors: Toyotaka Shimabe, Ogaki (JP); Keisuke Shimizu, Ogaki (JP); Toshiki Furutani, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 13/963,246

(22) Filed: Aug. 9, 2013

(65) Prior Publication Data
US 2014/0042602 A1 Feb. 13, 2014

(30) Foreign Application Priority Data
Aug. 10, 2012 (JP) .................................. 2012-178953

(51) Int. Cl.
*H01L 23/00* (2006.01)
*H05K 1/18* (2006.01)
*H01L 23/495* (2006.01)
*H01L 23/31* (2006.01)
*H01L 23/498* (2006.01)
*H01L 21/48* (2006.01)
*H01L 21/56* (2006.01)

(52) U.S. Cl.
CPC .......... *H05K 1/183* (2013.01); *H01L 23/49589* (2013.01); *H01L 24/80* (2013.01); *H05K 1/18* (2013.01); *H01L 23/3107* (2013.01); *H01L 23/49822* (2013.01); *H01L 21/4857* (2013.01); *H01L 21/568* (2013.01)
USPC .......................................... 257/668; 257/700

(58) Field of Classification Search
USPC .................... 257/668, 700; 438/123; 174/200
See application file for complete search history.

(56) References Cited

U.S. PATENT DOCUMENTS 6,952,049 B1 * 10/2005 Ogawa et al. ................. 257/700

FOREIGN PATENT DOCUMENTS

| JP | 2002-100875 | | 4/2002 |
| JP | 2002-359319 | A | 12/2002 |
| JP | 2003-209201 | | 7/2003 |
| JP | 2010-226069 | | 10/2010 |

* cited by examiner

*Primary Examiner* — Roy Potter
(74) *Attorney, Agent, or Firm* — Oblon, Spivak, McClelland, Maier & Neustadt, L.L.P.

(57) ABSTRACT

A wiring board includes a substrate having a cavity, and an electronic component accommodated in the cavity of the substrate. The substrate has a thickness which is greater than a thickness of the electronic component such that a ratio of the thickness of the substrate to the thickness of the electronic component is set in a range of 0.3 or greater and 0.7 or less.

16 Claims, 9 Drawing Sheets

FIG.24 ions of which are incorporated herein by reference in this application.

WIRING BOARD AND METHOD FOR MANUFACTURING WIRING BOARD

CROSS-REFERENCE TO RELATED APPLICATIONS

The present application is based upon and claims the benefit of priority from Japanese Application No. 2012-178953, filed Aug. 10, 2012, the entire contents of which are incorporated herein by reference.

BACKGROUND OF THE INVENTION

1. Field of the Invention

The present invention relates to a wiring board and its manufacturing method.

2. Description of Background Art

Japanese Laid-Open Patent Publication No. 2002-100875 describes a wiring board in which a capacitor is accommodated in a cavity formed in a base substrate. The entire contents of Japanese Laid-Open Patent Publication No. 2002-100875 are incorporated by reference in this application.

SUMMARY OF THE INVENTION

According to one aspect of the present invention, a wiring board includes a substrate having a cavity, and an electronic component accommodated in the cavity of the substrate. The substrate has a thickness which is greater than a thickness of the electronic component such that a ratio of the thickness of the substrate to the thickness of the electronic component is set in a range of 0.3 or greater and 0.7 or less.

According to another aspect of the present invention, a method for manufacturing a wiring board includes forming a cavity in a substrate, and accommodating in the cavity of the substrate an electronic component having a thickness which is less than a thickness of the substrate such that a ratio of the thickness of the substrate to the thickness of the electronic component is set in a range of 0.3 or greater to 0.7 or lower.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

The embodiments will now be described with reference to the accompanying drawings, wherein like reference numerals designate corresponding or identical elements throughout the various drawings.

The descriptions below use a coordinate system of axes (X, Y, Z), which cross perpendicular to each other.

Figure 1:
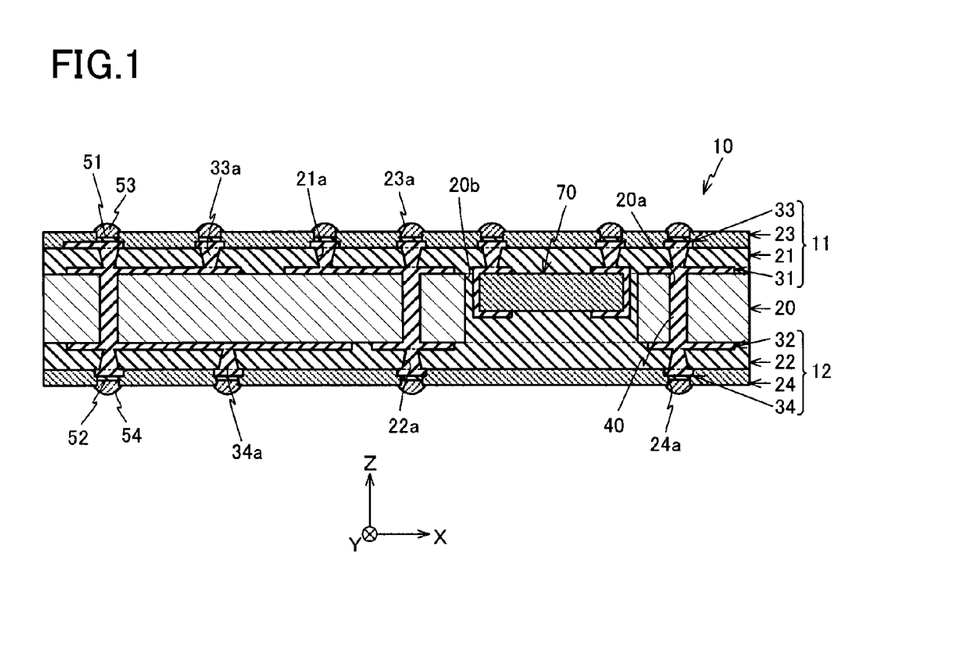
FIG. 1 is a cross sectional view of a wiring board according to an embodiment of the present invention.

FIG. 1 is an XZ cross-sectional view of wiring board 10 according to the present embodiment. Wiring board 10 has base substrate 20, buildup layer 11 formed on an upper surface (the (+Z) side surface) of base substrate 20 and buildup layer 12 formed on a lower surface (the (−Z) side surface) of base substrate 20.

Buildup layer 11 is formed with conductive patterns 31 formed on the upper surface of base substrate 20, insulation layer 21 formed on the upper surface of base substrate 20 to coat conductive patterns 31, conductive patterns 33 formed on the upper surface of insulation layer 21, and solder-resist layer 23 formed on the upper surface of insulation layer 21 to coat conductive patterns 33.

Buildup layer 12 is formed with conductive patterns 32 formed on the lower surface of base substrate 20, insulation layer 22 formed on the lower surface of base substrate 20 to coat conductive patterns 32, conductive patterns 34 formed on the lower surface of insulation layer 22, and solder-resist layer 24 formed on the lower surface of insulation layer 22 to coat conductive patterns 34.

Base substrate 20 is made of a plate material with an approximate thickness of 1000 μm. Base substrate 20 is made, for example, by impregnating a reinforcing material such as fiberglass or aramid fiber with epoxy resin. As shown in FIG. 1, penetrating holes (20a) for through-hole conductors and cavity (20b) to accommodate capacitor 70 are formed in base substrate 20.

Through-hole conductor 40 is formed in penetrating hole (20a). Through-hole conductors 40 are made of copper plating.

Capacitor 70 is a rectangular chip capacitor with an approximate thickness of 500 μm. Capacitor 70 is accommodated in cavity (20b) in such a way that the upper surfaces of a pair of electrodes formed on either side in direction X are set at the same height as conductive patterns 31 formed on the upper surface of base substrate 20. At this time, the upper surface of capacitor 70 is positioned on the same plane as that of the upper surface of base substrate 20. In the present embodiment, when the thickness of capacitor 70 is set as (D1) (=500 μm) and the thickness of base substrate 20 as (D2) (=1000 μm), the thickness ratio (D1)/(D2) is approximately 0.5.

Conductive patterns 31 are formed on the upper surface of base substrate 20, and conductive patterns 32 are formed on the lower surface of base substrate 20. Conductive patterns (31, 32) are each 5~30 μm thick, and are patterned in a predetermined shape. Conductive patterns (31, 32) form electronic circuits of wiring board 10, and are electrically connected by through-hole conductors 40.

Insulation layer 21 is formed to coat the upper surface of base substrate 20. Insulation layer 21 is made of cured prepreg, for example. Insulation layer 21 electrically insulates conductive patterns 31 formed on the upper surface of base substrate 20 from conductive patterns 33 formed on the upper surface of insulation layer 21.

Prepreg is formed, for example, by impregnating fiberglass or aramid fiber with epoxy resin, polyester resin, bismaleimide triazine resin (BT resin), imide resin (polyimide), phenolic resin, allyl polyphenylene ether resin (A-PPE resin) or the like. In wiring board 10, the thickness of insulation layer 21 is 10~60 μm.

Multiple via holes (21a) are formed in insulation layer 21. Via conductor (33a) is formed in via hole (21a). Via conductors (33a) are made of copper plating.

Insulation layer 22 is formed to coat the lower surface of base substrate 20.

Insulation layer 22 is made of cured prepreg, for example, the same as insulation layer 21. Insulation layer 22 electrically insulates conductive patterns 32 formed on the lower surface of base substrate 20 from conductive patterns 34 formed on the lower surface of insulation layer 22. The thickness of insulation layer 22 is 10~60 μm, the same as insulation layer 21.

Multiple via holes (22a) are formed in insulation layer 22. Via conductor (34a) is formed in via hole (22a). Via conductors (34a) are made of copper plating.

Conductive patterns 33 are formed on the upper surface of insulation layer 21, and conductive patterns 34 are formed on the lower surface of insulation layer 22. Conductive patterns (33, 34) are each 5~20 μm thick and are patterned in a predetermined shape. Conductive patterns 33 are electrically connected to conductive patterns 31 and capacitor 70 by via conductors (33a) formed in insulation layer 21. Conductive patterns 34 are electrically connected to conductive patterns 32 by via conductors (34a) formed in insulation layer 22.

Solder-resist layer 23 is formed to coat insulation layer 21. Solder-resist layer 24 is formed to coat insulation layer 22. Solder-resist layers (23, 24) are each made of photosensitive resin using epoxy acrylic resin, thermosetting resin mainly containing epoxy resin, or UV-curable resin or the like, for example.

In solder-resist layer 23, multiple openings (23a) are formed for connection with conductive patterns 33 and an electronic component to be mounted on wiring board 10. Double-layer solder connection layer 51, which is made of nickel-plated film and gold-plated film and coats surfaces of conductive patterns 33, is formed in openings (23a). Terminals of the electronic component mounted on wiring board 10 are connected to solder connection layer 51 through solder 53.

Also, multiple openings (24a) are formed in solder-resist layer 24. Double-layer solder connection layer 52, which is made of nickel-plated film and gold-plated film and coats surfaces of conductive patterns 34, is formed in openings (24a). Terminals of an electronic component mounted on wiring board 10 are connected to solder connection layer 52 through solder 54.

A component such as an IC is mounted mostly on the upper surface of wiring board 10 structured as above.

Next, a method for manufacturing wiring board 10 is described.

Figure 2:
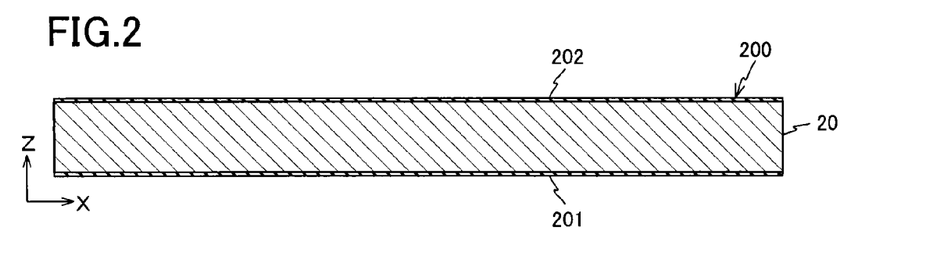
FIG. 2 is a view illustrating a method for manufacturing a wiring board according to an embodiment of the present invention.

First, copper-clad laminate 200 is prepared, being made up of base substrate 20 and copper foils (202, 201) laminated respectively on upper and lower surfaces of base substrate 20, as shown in FIG. 2.

Figure 3:
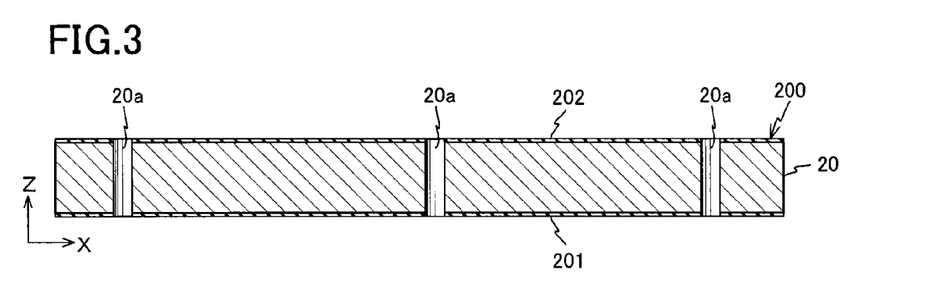
FIG. 3 is a view illustrating the method for manufacturing a wiring board according to the embodiment.

Using a drill or the like, penetrating holes (20a) are formed in copper-clad laminate 200 as shown in FIG. 3.

Figure 4:
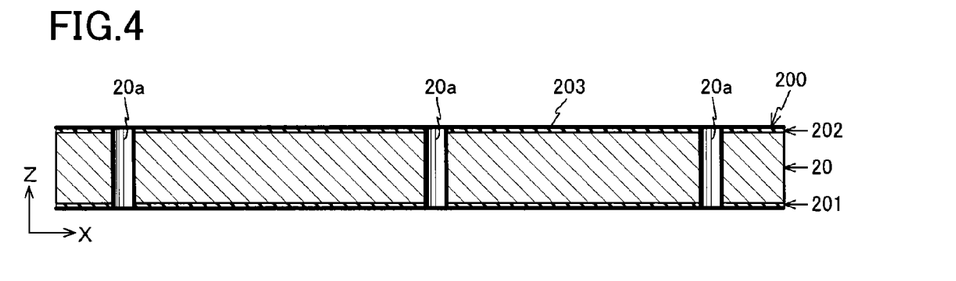
FIG. 4 is a view illustrating the method for manufacturing a wiring board according to the embodiment.

A catalyst mainly containing palladium (Pd), for example, is attached on surfaces of copper-clad laminate 200 and on the inner walls of penetrating holes (20a). Then, electroless copper plating is performed on copper-clad laminate 200. Accordingly, electroless plated film 203 as a seed layer is formed on the surfaces of copper-clad laminate 200 and on the inner walls of penetrating holes (20a) as shown in FIG. 4.

Figure 5:
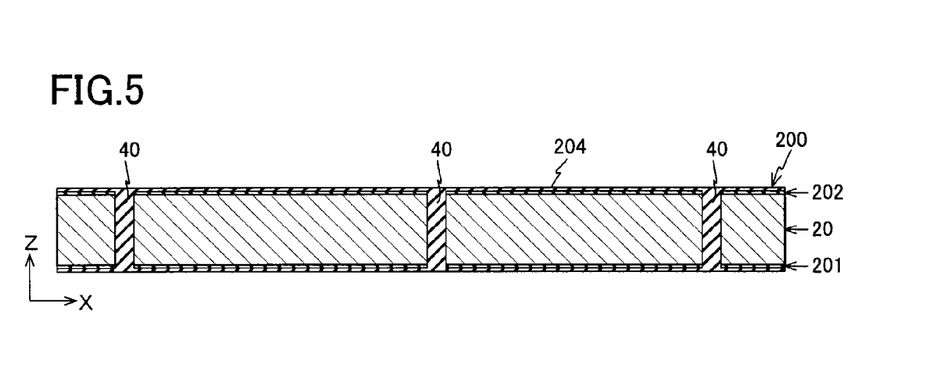
FIG. 5 is a view illustrating the method for manufacturing a wiring board according to the embodiment.

Electrolytic copper plating is performed on copper-clad laminate 200 where electroless plated film 203 is formed. Accordingly, as shown in FIG. 5, plated film 204 is formed on surfaces of copper-clad laminate 200, and through-hole conductors 40 are formed in penetrating holes (20a).

Figure 6:
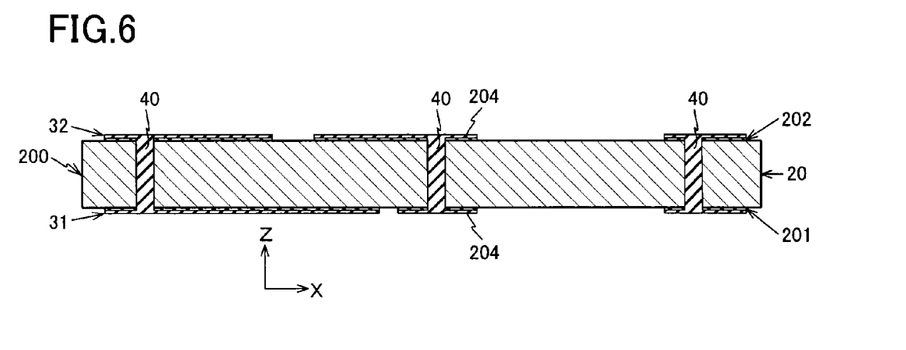
FIG. 6 is a view illustrating the method for manufacturing a wiring board according to the embodiment.

Copper foils (202, 201) and plated film 204 are patterned by a tenting method or the like. By doing so, as shown in FIG. 6, conductive patterns 31 made of copper foil 201 and plated film 204 as well as conductive patterns 32 made of copper foil 202 and plated film 204 are formed.

Figure 7:
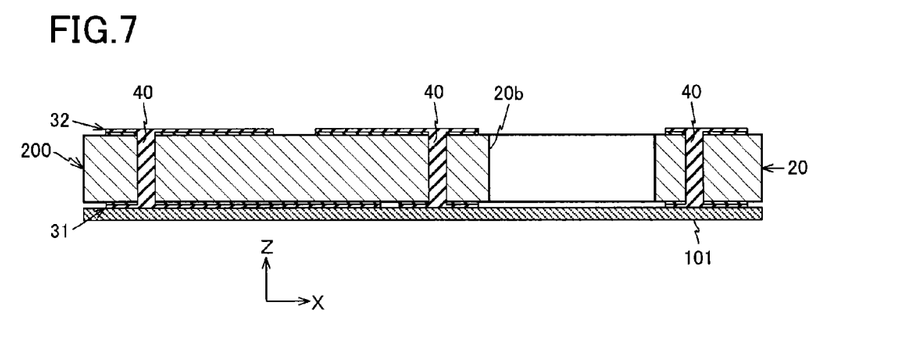
FIG. 7 is a view illustrating the method for manufacturing a wiring board according to the embodiment.

Using a router or the like, for example, cavity (20b) is formed in base substrate 20 as shown in FIG. 7. Then, adhesive sheet 101 is laminated on the lower-surface side of copper-clad laminate 200.

Figure 8:
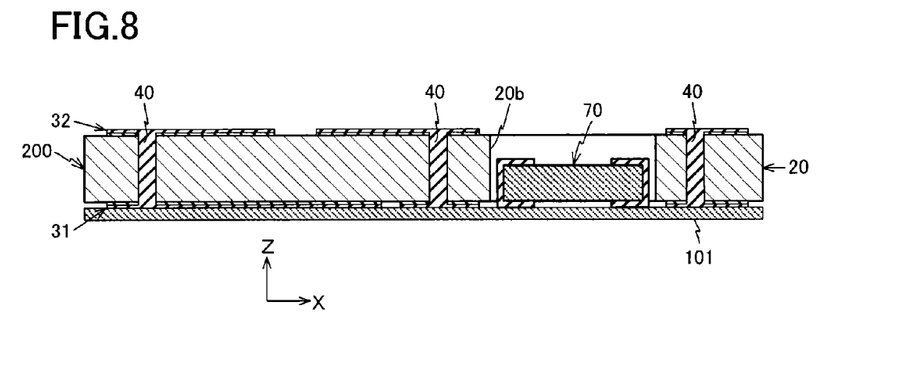
FIG. 8 is a view illustrating the method for manufacturing a wiring board according to the embodiment.

Capacitor 70 is accommodated in cavity (20b) as shown in FIG. 8.

Figure 9:
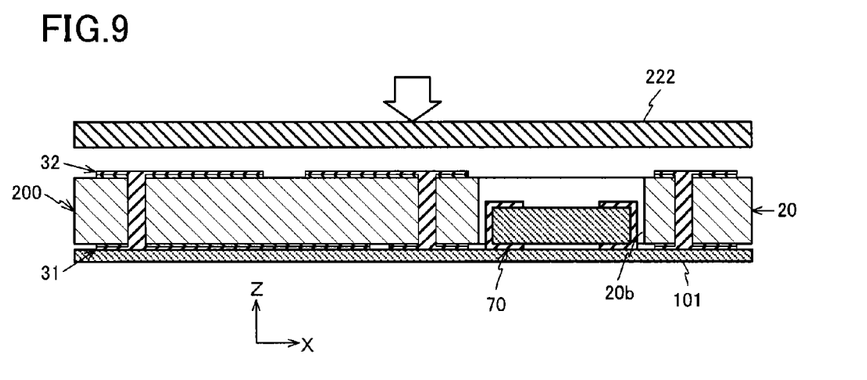
FIG. 9 is a view illustrating the method for manufacturing a wiring board according to the embodiment.
Figure 10:
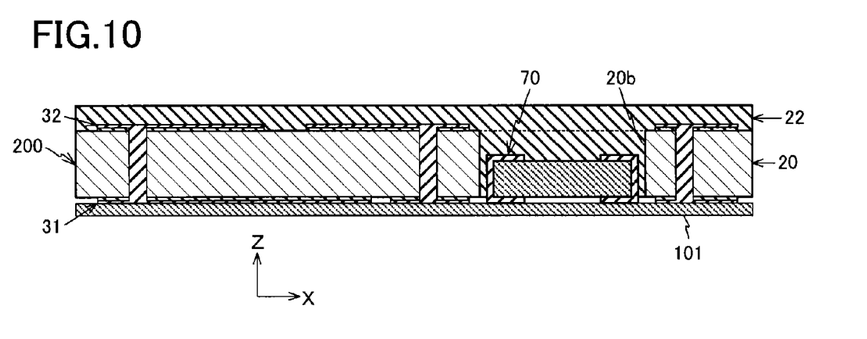
FIG. 10 is a view illustrating the method for manufacturing a wiring board according to the embodiment.

As shown in FIG. 9, film 222 made of thermosetting resin is placed on the upper surface of copper-clad laminate 200. Then, lamination treatment is conducted on film 222 so that film 222 is pressed and adhered to copper-clad laminate 200. Accordingly, on the upper surface of base substrate 20, insulation layer 22 is formed to coat conductive patterns 32 as shown in FIG. 10. Also, cavity (20b) formed in base substrate 20 is filled with the resin of film 222 and other resin that has seeped from base substrate 20.

Figure 11:
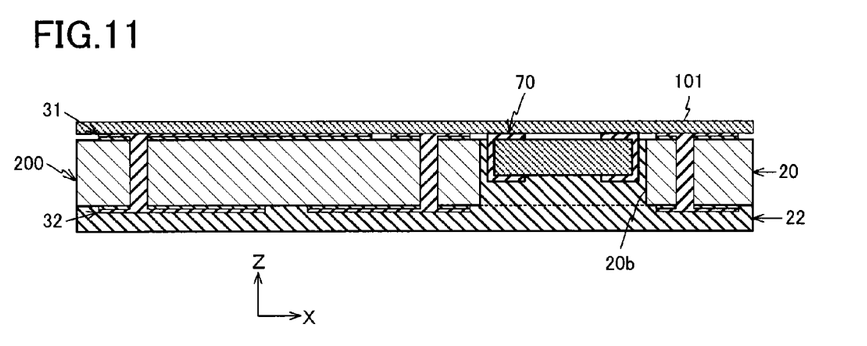
FIG. 11 is a view illustrating the method for manufacturing a wiring board according to the embodiment.

Upper-surface and lower-surface sides of copper-clad laminate 200 with insulation layer 22 formed thereon are inversed as shown in FIG. 11.

Figure 12:
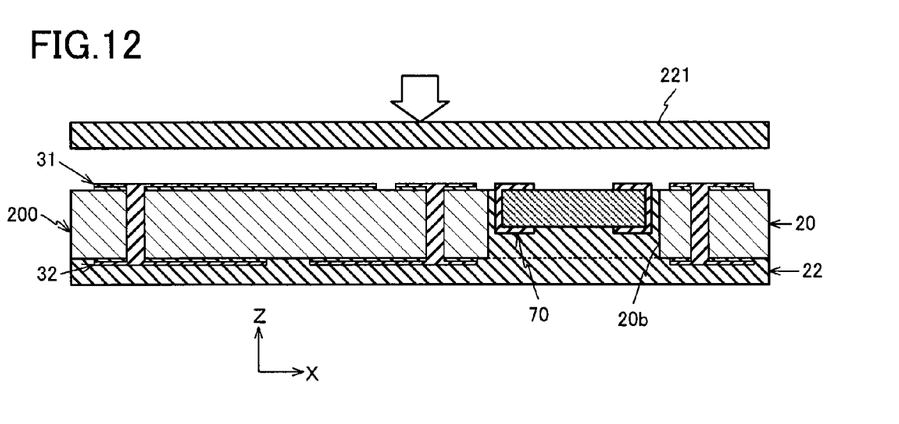
FIG. 12 is a view illustrating the method for manufacturing a wiring board according to the embodiment.
Figure 13:
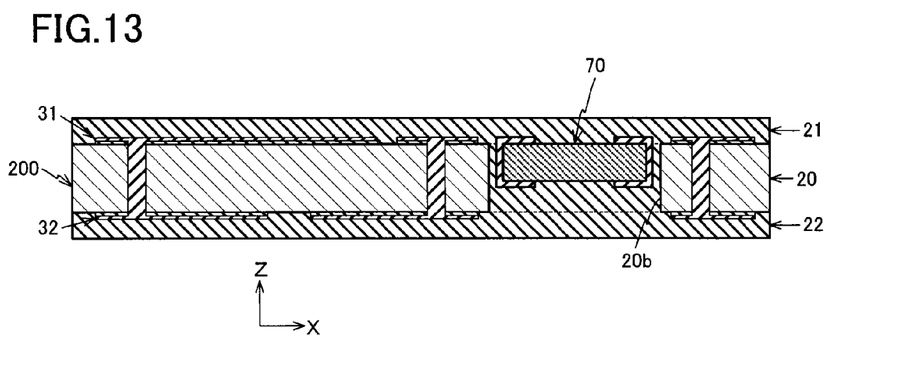
FIG. 13 is a view illustrating the method for manufacturing a wiring board according to the embodiment.

Adhesive sheet 101 laminated on the upper-surface side of copper-clad laminate 200 is removed, and film 221 made of thermosetting resin is placed on the upper surface of copper-clad laminate 200 as shown in FIG. 12. Then, lamination treatment is conducted on film 221 so that film 221 is pressed and adhered to copper-clad laminate 200. Accordingly, on the upper surface of base substrate 20, insulation layer 21 is formed to coat conductive patterns 31 as shown in FIG. 13.

Also, cavity (20b) formed in base substrate 20 is filled with the resin of film 221 and other resin that has seeped from base substrate 20.

Figure 14:
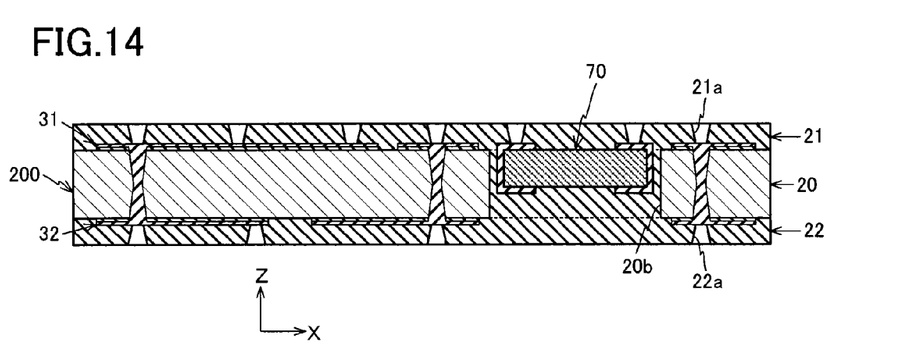
FIG. 14 is a view illustrating the method for manufacturing a wiring board according to the embodiment.

Laser beams are irradiated on insulation layers (21, 22) respectively to form via holes (21a, 22a) whose inner diameters increase toward the outside as shown in FIG. 14. Then, desmearing is conducted to remove smears remaining inside via holes (21a, 22a).

Figure 15:
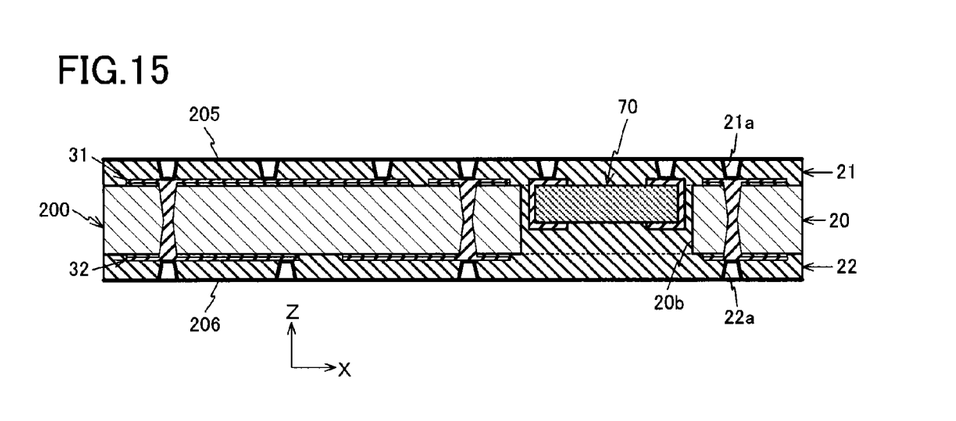
FIG. 15 is a view illustrating the method for manufacturing a wiring board according to the embodiment.

Copper-clad laminate 200 is immersed in a catalyst solution mainly containing Pd or the like. Accordingly, the catalyst is attached to surfaces of insulation layers (21, 22). Then, copper-clad laminate 200 is immersed in an electroless copper plating solution. In so doing, electroless plated film 205 is formed on the surface of insulation layer 21 and on the inner walls of via holes (21a). Also, electroless plated film 206 is formed on the surface of insulation layer 22 and on the inner walls of via holes (22a).

Figure 16:
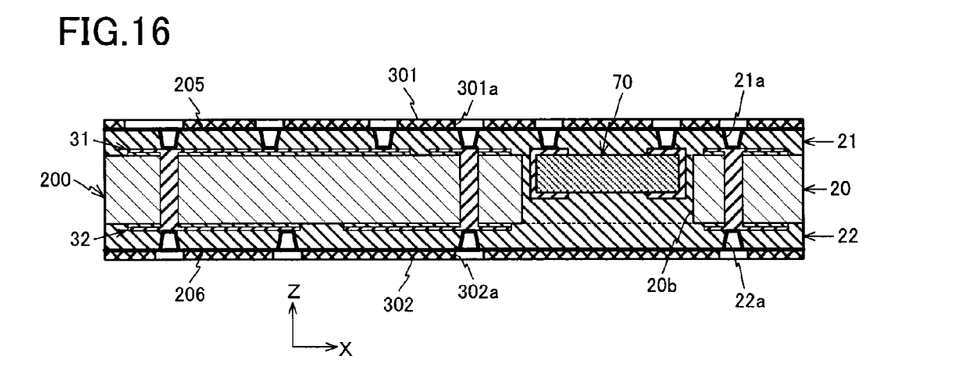
FIG. 16 is a view illustrating the method for manufacturing a wiring board according to the embodiment.

Photosensitive dry film is laminated on surfaces of electroless plated films (205, 206). Masking films with predetermined patterns are respectively laminated on the photosensitive dry films. The photosensitive dry films are exposed to UV rays and developed using an alkaline solution. Accordingly, openings (301a, 302a) are formed in the photosensitive dry films to expose portions for forming conductive patterns (33, 34) as shown in FIG. 16. The photosensitive dry films make plating resists (301, 302).

Figure 17:
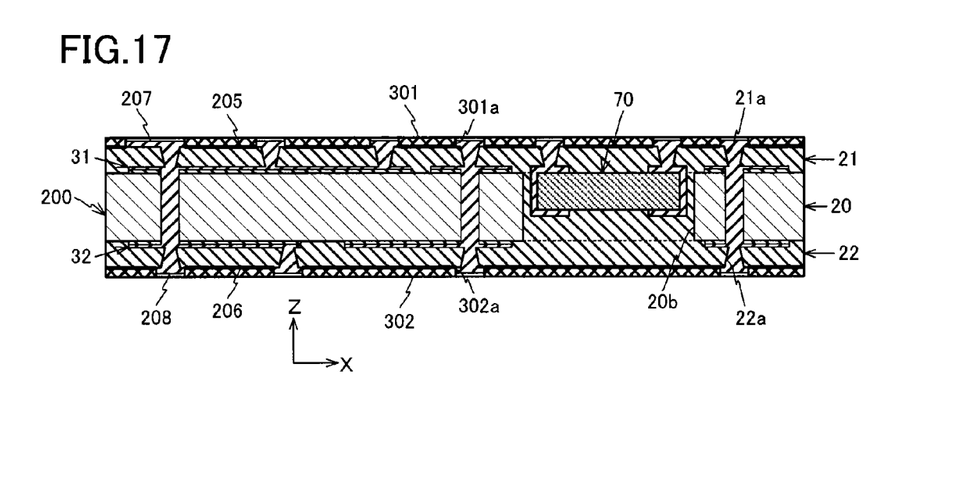
FIG. 17 is a view illustrating the method for manufacturing a wiring board according to the embodiment.

Plating resists (301, 302) are washed with water and dried. Then, electrolytic copper plating is performed on electroless plated film (205, 206) exposed through openings (301a, 302a) of plating resists (301, 302). Accordingly, as shown in FIG. 17, plated films (207, 208) are formed, being exposed from plating resists (301, 302).

Figure 18:
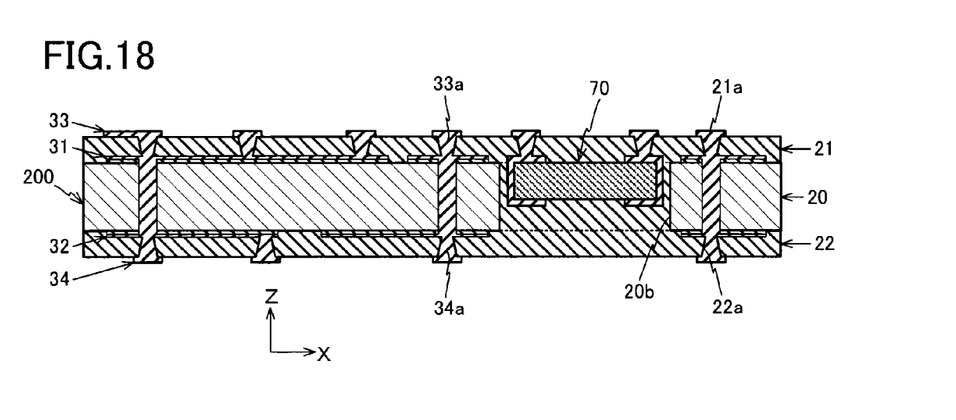
FIG. 18 is a view illustrating the method for manufacturing a wiring board according to the embodiment.

Plating resists (301, 302) are removed. Electroless plated films (205, 206) coated by plating resists (301, 302) are etched away. Accordingly, as shown in FIG. 18, conductive patterns 33 are formed on the surface of insulation layer 21, and via conductors (33a) are formed in via holes (21a). Also, conductive patterns 34 are formed on the surface of insulation layer 22, and via conductors (34a) are formed in via holes (22a).

Figure 19:
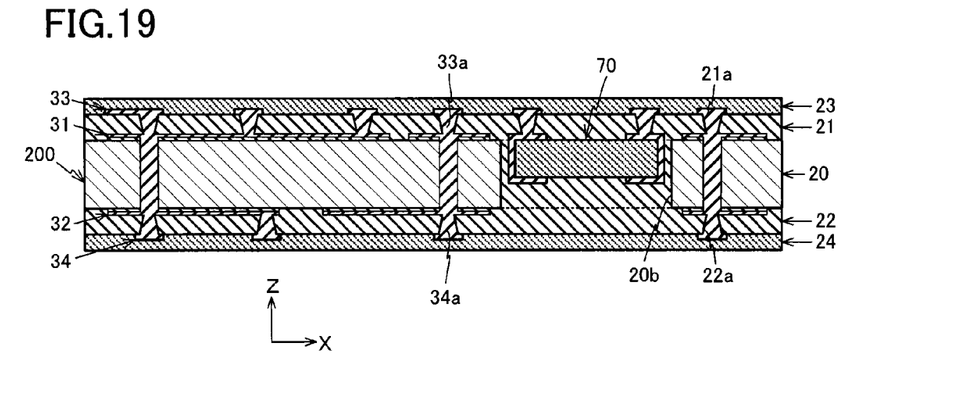
FIG. 19 is a view illustrating the method for manufacturing a wiring board according to the embodiment.

Solder-resist layers (23, 24) are respectively formed on insulation layers (21, 22) to coat conductive patterns (33, 34), as shown in FIG. 19.

Figure 20:
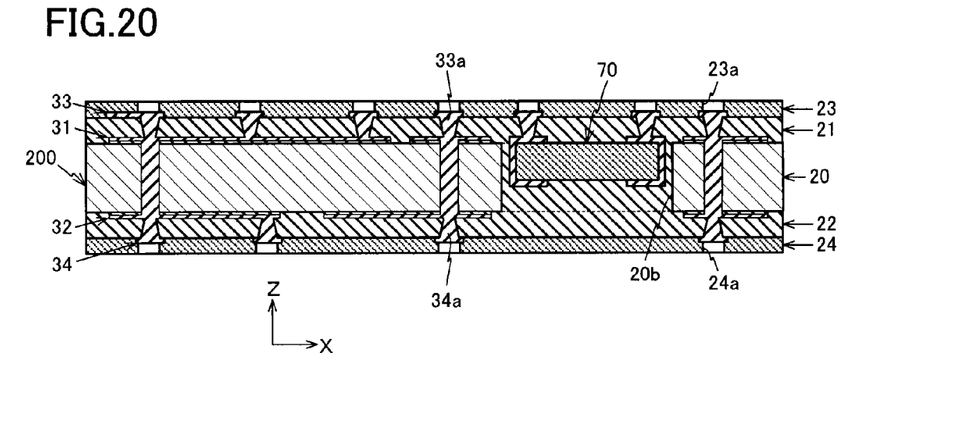
FIG. 20 is a view illustrating the method for manufacturing a wiring board according to the embodiment.

As shown in FIG. 20, openings (23a) are formed in solder-resist layer 23 to expose portions of conductive patterns 33, and openings (24a) are formed in solder-resist layer 24 to expose portions of conductive patterns 34.

Figure 21:
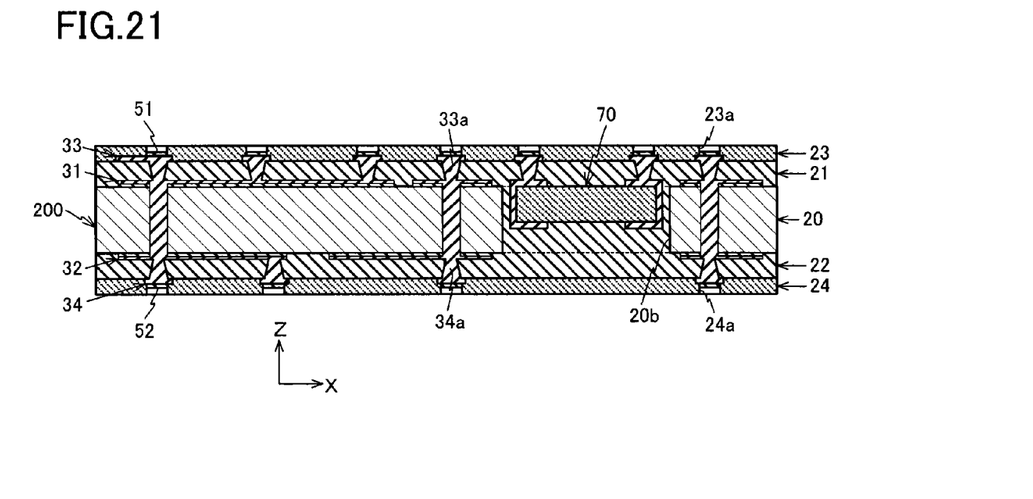
FIG. 21 is a view illustrating the method for manufacturing a wiring board according to the embodiment.

On surfaces of conductive patterns (33, 34) exposed in openings (23a, 24a), electroless Ni/Pd/Au plating is performed. Accordingly, as shown in FIG. 21, solder-connection layer 51 is formed on surfaces of conductive patterns 33 exposed in openings (23a) of solder-resist layer 23, and solder-connection layer 52 is formed on surfaces of conductive patterns 34 exposed in openings (24a) of solder-resist layer 24.

Solder (53, 54) is applied on solder-connection layers (51, 52). Accordingly, wiring board 10 is completed as shown in FIG. 1.

As described above, in wiring board 10 of the present embodiment, the thickness of base substrate 20 is relatively great compared with the thickness of capacitor 70. In particular, when the thickness of capacitor 70 is set as (D1) and the thickness of base substrate 20 as (D2), thickness ratio (D1)/(D2) is approximately 0.5. Therefore, the thickness of base substrate 20 is approximately twice the thickness of capacitor 70. Thus, the thickness of base substrate 20 to accommodate capacitor 70 is set sufficiently thicker than the thickness of capacitor 70. As a result, the strength of wiring board 10 is enhanced.

In wiring board 10 of the present embodiment, capacitor 70 is positioned closer to the upper surface of base substrate 20, but farther from the lower surface of base substrate 20, as shown in FIG. 1. Therefore, warping of wiring board 10 is designed to be in one direction only so that the mounting of an electronic component is determined in consideration of the direction of warping.

For example, when an electronic component with the same thickness as that of a base substrate is accommodated in a cavity formed in the base substrate, the amount of resin filled in the cavity is substantially the same on the upper-surface side and lower-surface side of the electronic component. In such an example, whether the wiring board warps to cause the upper surface to protrude or to cause the lower surface to protrude depends on individual differences in the wiring board or manufacturing conditions.

By contrast, as shown in FIG. 1, when the position of capacitor 70 accommodated in cavity (20b) formed in base substrate 20 is shifted to the upper-surface side, wiring board 10 warps to cause the upper surface to protrude when the temperature of wiring board 10 is at room temperature, the same as its ambient temperature, and that its warping gradually subsides as the temperature of wiring board 10 rises. Therefore, it is predicted that wiring board 10 of the present embodiment will warp to cause mainly its upper surface to protrude. Accordingly, when an electronic component is mounted on wiring board 10 in accordance with such a prediction, the mounting accuracy on wiring board 10 is enhanced. As a result, reliability is enhanced for the product made of wiring board 10 and the component mounted on wiring board 10.

So far, the embodiments of the present invention have been described. However, the present invention is not limited to the above embodiments.

For example, in the embodiment described above, when the thickness of capacitor 70 is set as (D1) and the thickness of base substrate 20 as (D2), the thickness ratio (D1)/(D2) is approximately 0.5. However, that is not the only option. When the thickness ratio (D1)/(D2) is 0.3 or greater but 0.7 or lower, the effects described above are also achieved.

The above embodiments described an example in which the upper surface of capacitor 70 is positioned on the same plane as the upper surface of base substrate 20. However, the present invention is not limited to such an example. It is an option for capacitor 70 to be positioned in such a way that the distance from capacitor 70 to the upper surface of base substrate 20 is shorter than the distance from capacitor 70 to the lower surface of base substrate 20.

In such an example, it is also predicted that wiring board 10 will warp to cause its upper surface to protrude. Therefore, when an electronic component is mounted on wiring board 10 in accordance with such a prediction, the mounting accuracy on wiring board 10 is also enhanced.

The above embodiments described an example in which the upper surface of capacitor 70 is positioned on the same plane as the upper surface of base substrate 20. However, the present invention is not limited to such an example. It is an option for the lower surface of capacitor 70 to be positioned on the same plane as the lower surface of base substrate 20. Alternatively, it is yet another option for capacitor 70 to be positioned in such a way that the distance from capacitor 70 to the lower surface of base substrate 20 is shorter than the distance from capacitor 70 to the upper surface of base substrate 20.

Namely, as long as capacitor 70 accommodated in cavity (20b) of base substrate 20 is positioned to be shifted toward the upper-surface side or the lower-surface side of base substrate 20, it is predicted that wiring board 10 will warp to cause its upper surface to protrude or its lower surface to protrude. Therefore, when an electronic component is mounted on wiring board 10 in accordance with such a prediction, the mounting accuracy on wiring board 10 is also enhanced.

In the embodiments above, capacitor 70 was accommodated in cavity (20b) of base substrate 20. However, that is not the only option. Instead of a capacitor, electronic components such as reactor 60 may also be accommodated in cavity (20b) of base substrate 20.

Figure 22:
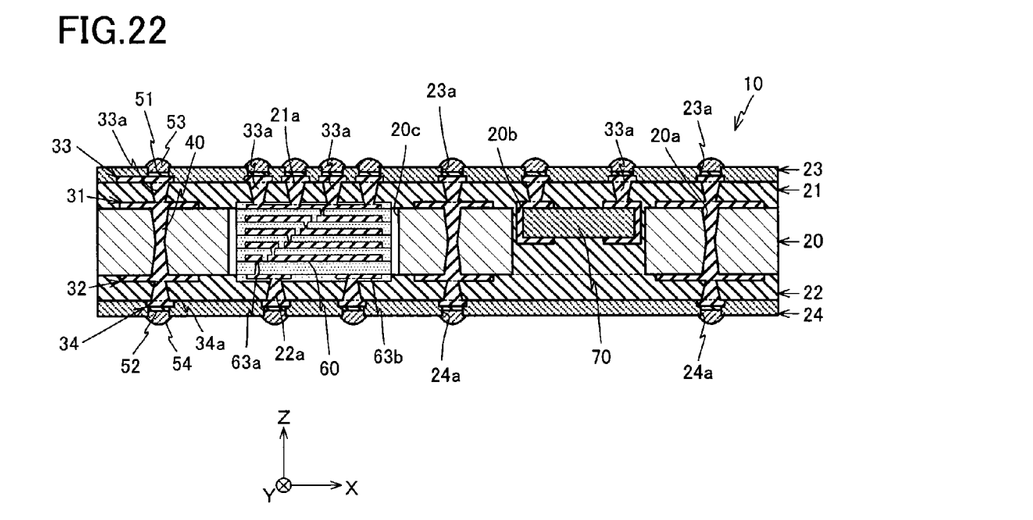
FIG. 22 is a view showing a modification of a wiring board.

In the embodiments above, one capacitor 70 was accommodated in base substrate 20. However, the present invention is not limited to such an example. As shown in FIG. 22 as an example, it is an option to form multiple cavities (20b, 20c) in base substrate 20 so that capacitor 70 is accommodated in one cavity (20b) and another electronic component such as reactor 60 is accommodated in the other cavity (20c). Alternatively, three or more cavities may be formed in base substrate 20 to accommodate capacitor 70 and multiple electronic components other than capacitor 70.

Figure 23:
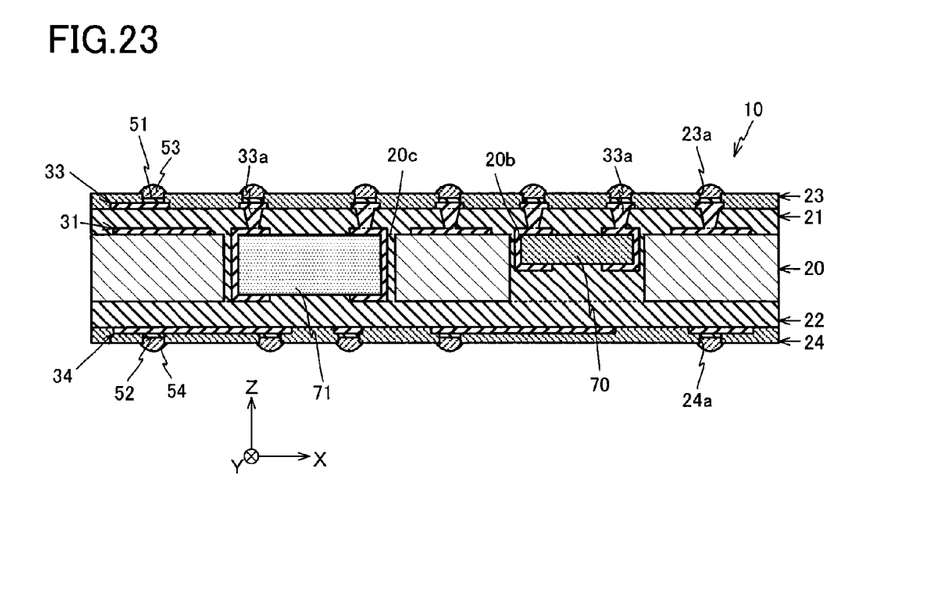
FIG. 23 is a view showing another modification of a wiring board.

In the embodiments above, conductive patterns 31 were formed on the upper surface of base substrate 20 and conductive patterns 32 were formed on the lower surface of base substrate 20. However, that is not the only option. As an example shown in FIG. 23, when capacitors (70, 71) are accommodated in cavities (20b, 20c), conductive patterns may be formed on either the upper or lower surface of base substrate 20, while an insulation layer is formed on the other surface.

Figure 24:
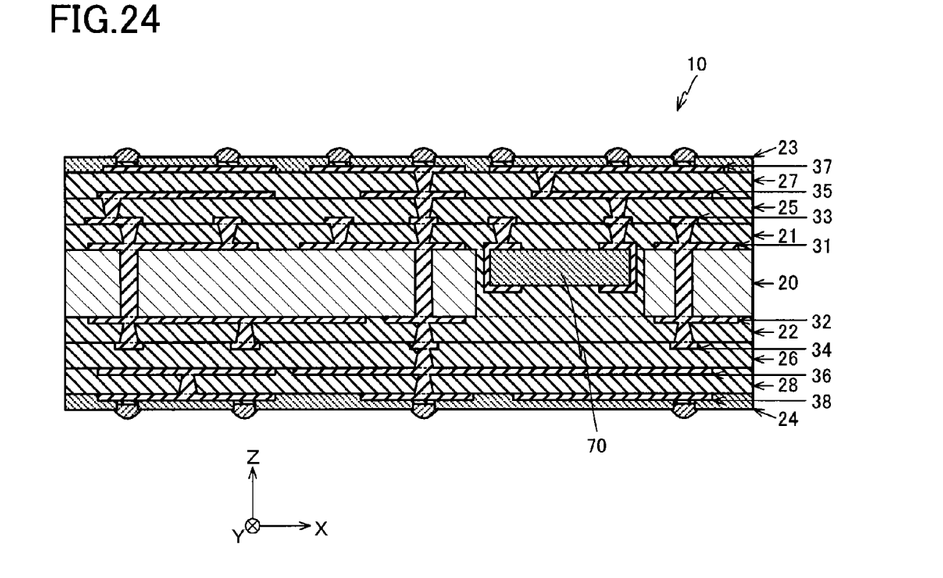
FIG. 24 is a view showing yet another modification of a wiring board.

In the embodiments above, as shown in FIG. 1, conductive patterns (31, 33) and insulation layer 21 were laminated on an upper surface of base substrate 20, and conductive patterns (32, 34) and insulation layer 22 were laminated on a lower surface of base substrate 20. However, the present invention is not limited to such an example. As shown in FIG. 24, it is an option to form three or more conductive patterns (31, 33, 35, 37) and two or more insulation layers (21, 25, 27) on an upper surface of base substrate 20, and to form three or more conductive patterns (32, 34, 36, 38) and two or more insulation layers (22, 26, 28) on a lower surface of base substrate 20.

Nickel, titanium, chrome or the like may be used as the material for electroless plating. Also, PVD film or CVD film may be used instead of electroless plating. Using a catalyst is not required when PVD film or CVD film is applied.

Nickel, titanium, chrome or the like may also be used as the material for the electrolytic plated film.

Plating means depositing a conductor (such as a metal) to form a layer on surfaces of metal or resin, as well as the deposited conductor (such as a metal layer). Plating includes dry plating such as PVD (physical vapor deposition), CVD (chemical vapor deposition) or the like in addition to wet plating such as electrolytic plating, electroless plating or the like.

The method for forming conductive patterns 31 through 38 and their patterning method are not limited specifically, and a semi-additive method, subtractive method or the like may be properly selected according to the purposes of wiring board 10.

A wiring board according to a first aspect of the present invention has a base substrate in which a cavity is formed, and an electronic component accommodated in the cavity of the base substrate. In such a wiring board, the ratio of the thickness of the base substrate to the thickness of the electronic component is set at 0.3 or greater but 0.7 or lower.

A method for manufacturing a wiring board according to a second aspect of the present invention includes forming a cavity in a base substrate and accommodating an electronic component in the cavity. In such a manufacturing method, the ratio of the thickness of the base substrate to the thickness of the electronic component is set at 0.3 or greater but 0.7 or lower.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
   a substrate having a cavity, a first surface and a second surface on an opposite side of the first surface;
   an electronic component accommodated in the cavity of the substrate; and
   an insulation layer formed on the first surface of the substrate such that the insulation layer is covering an opening of the cavity,
   wherein the substrate has a thickness which is greater than a thickness of the electronic component such that a ratio of the thickness of the substrate to the thickness of the electronic component is set in a range of 0.3 or greater and 0.7 or less, and the electronic component is positioned in the cavity of the substrate such that a distance from the first surface of the substrate to the electronic component is set less than a distance from the second surface of the substrate to the electronic component.

2. The wiring board according to claim 1, wherein the electronic component is positioned in the cavity of the substrate such that the electronic component has a surface which forms a same plane as the first surface of the substrate.

3. The wiring board according to claim 1, further comprising an integrated circuit mounted on a first surface side of the substrate.

4. The wiring board according to claim 2, further comprising an integrated circuit mounted on a first surface side of the substrate.

5. The wiring board according to claim 1, wherein the electronic component is a capacitor.

6. The wiring board according to claim 4, wherein the electronic component is a capacitor.

7. A wiring board, comprising:
   a substrate having a cavity;
   an electronic component accommodated in the cavity of the substrate; and
   a second electronic component,
   wherein the substrate has a thickness which is greater than a thickness of the electronic component such that a ratio of the thickness of the substrate to the thickness of the electronic component is set in a range of 0.3 or greater and 0.7 or less, the substrate has a second cavity, and the second electronic component has a thickness which is substantially equal to a thickness of the substrate and is accommodated in the second cavity of the substrate.

8. The wiring board according to claim 1, further comprising:
   a first buildup layer formed on the first surface of the substrate and comprising a plurality of conductive layers and a plurality of insulation layers alternately laminated; and a second buildup layer formed on the second surface of the substrate and comprising a plurality of conductive layers and a plurality of insulation layers alternately laminated.

9. A method for manufacturing a wiring board, comprising:
forming a cavity in a substrate having a first surface and a second surface on an opposite side of the first surface;
accommodating in the cavity of the substrate an electronic component having a thickness which is less than a thickness of the substrate such that a ratio of the thickness of the substrate to the thickness of the electronic component is set in a range of 0.3 or greater to 0.7 or lower; and
forming an insulation layer on the first surface of the substrate such that the insulation layer is covering an opening of the cavity,
wherein the accommodating of the electronic component comprises positioning the electronic component in the cavity of the substrate such that a distance from the first surface of the substrate to the electronic component is set less than a distance from the second surface of the substrate to the electronic component.

10. The method for manufacturing a wiring board according to claim 9, wherein the accommodating of the electronic component comprises positioning the electronic component in the cavity of the substrate such that the electronic component has a surface which forms a same plane as the first surface of the substrate.

11. The method for manufacturing a wiring board according to claim 9, further comprising mounting an integrated circuit on a first surface side of the substrate.

12. The method for manufacturing a wiring board according to claim 10, further comprising mounting an integrated circuit on a first surface side of the substrate.

13. The method for manufacturing a wiring board according to claim 9, wherein the electronic component is a capacitor.

14. The method for manufacturing a wiring board according to claim 12, wherein the electronic component is a capacitor.

15. The method for manufacturing a wiring board according to claim 9, further comprising:
forming a second cavity in the substrate; and
accommodating in the second cavity a second electronic component having a thickness which is substantially equal to the thickness of the substrate.

16. The method for manufacturing a wiring board according to claim 9, further comprising:
forming on the first surface of the substrate a first buildup layer comprising a plurality of conductive layers and a plurality of insulation layers alternately laminated; and
forming on the second surface of the substrate a second buildup layer comprising a plurality of conductive layers and a plurality of insulation layers alternately laminated.

* * * * *